US006897123B2

(12) United States Patent
Winther

(10) Patent No.: US 6,897,123 B2
(45) Date of Patent: May 24, 2005

(54) BONDING OF PARTS WITH DISSIMILAR THERMAL EXPANSION COEFFICIENTS

(75) Inventor: Kaspar Tobias Winther, Upton, MA (US)

(73) Assignee: Agityne Corporation, Upton, MA (US)

(*) Notice: Subject to any disclaimer, the term of this patent is extended or adjusted under 35 U.S.C. 154(b) by 355 days.

(21) Appl. No.: 10/087,825

(22) Filed: Mar. 5, 2002

(65) Prior Publication Data

US 2002/0132443 A1 Sep. 19, 2002

Related U.S. Application Data

(60) Provisional application No. 60/273,070, filed on Mar. 5, 2001.

(51) Int. Cl.[7] .......................... H01L 21/30; H01L 21/46
(52) U.S. Cl. ........................ 438/455; 438/118; 428/547
(58) Field of Search .............................. 228/121, 122.1, 228/124.1, 124.7, 262.6; 428/408, 426, 547; 438/118, 455

(56) References Cited

U.S. PATENT DOCUMENTS

| | | |
|---|---|---|
| 3,191,004 A | 6/1965 | Hocker |
| 3,284,174 A | 11/1966 | Zimmer |
| 4,223,429 A | 9/1980 | Robinson |
| 4,314,866 A | 2/1982 | Webber |
| 5,163,770 A | 11/1992 | Soma et al. |
| 5,471,092 A | 11/1995 | Chan et al. |
| 5,495,978 A | 3/1996 | Muth |
| 5,552,637 A | 9/1996 | Yamagata |
| 5,812,570 A | 9/1998 | Spaeth |
| 5,821,617 A | 10/1998 | Autry et al. |
| 5,856,772 A | 1/1999 | Foote et al. |
| 5,857,050 A | 1/1999 | Jiang et al. |
| 5,864,470 A | 1/1999 | Shim et al. |
| 5,877,553 A | 3/1999 | Nakayama et al. |
| 5,915,937 A | 6/1999 | Christensen |
| 5,940,279 A | 8/1999 | Gademann et al. |
| 5,950,304 A | 9/1999 | Khandros et al. |
| 5,988,488 A | 11/1999 | Slattery et al. |
| 6,020,220 A | 2/2000 | Gilleo et al. |
| 6,020,646 A | 2/2000 | Boyle et al. |
| 6,030,884 A | 2/2000 | Mori |
| 6,039,439 A | 3/2000 | Komplin et al. |
| 6,077,612 A | 6/2000 | Hagedorn et al. |
| 6,089,444 A | 7/2000 | Slattery et al. |
| 6,090,643 A | 7/2000 | McCoy |
| 6,121,709 A | 9/2000 | Fathimulla et al. |
| 6,189,766 B1 | 2/2001 | Baker et al. |
| 6,204,090 B1 | 3/2001 | Boyle et al. |
| 6,252,301 B1 | 6/2001 | Gilleo et al. |
| 6,265,784 B1 | 7/2001 | Kawano et al. |
| 6,280,584 B1 | 8/2001 | Kumar et al. |
| 6,294,831 B1 | 9/2001 | Shishido et al. |
| 6,315,850 B1 | 11/2001 | Hagedorn et al. |

FOREIGN PATENT DOCUMENTS

| | | |
|---|---|---|
| EP | 0 907 204 A2 | 4/1999 |
| WO | WO 97 41594 A1 | 11/1997 |
| WO | WO 99 55470 A1 | 11/1999 |

*Primary Examiner*—Asok Kumar Sarkar

(57) ABSTRACT

A method for bonding materials with different thermal expansion coefficients is provided. An intermediary layer of glass, ceramics, polymers, metals or composites is inserted between the materials to be bonded; this intermediary layer has a compositional gradient that could have been formed through diffusion processes. The coefficient of thermal expansion changes across the intermediary layer and on each side it is not substantially different from the coefficient of thermal expansion of the material that the layer is facing. In that manner there is nowhere within the intermediate layer or on the interfaces to the materials being bonded that thermally induced stress will cause fractures or significant permanent plastic deformation. The thickness of the intermediary layer depends on the difference in the coefficient of thermal expansion between the two materials being bonded, the temperature range the bond will be exposed to and the elasticity.

9 Claims, 1 Drawing Sheet

Partial cut away view of the bonding structure.

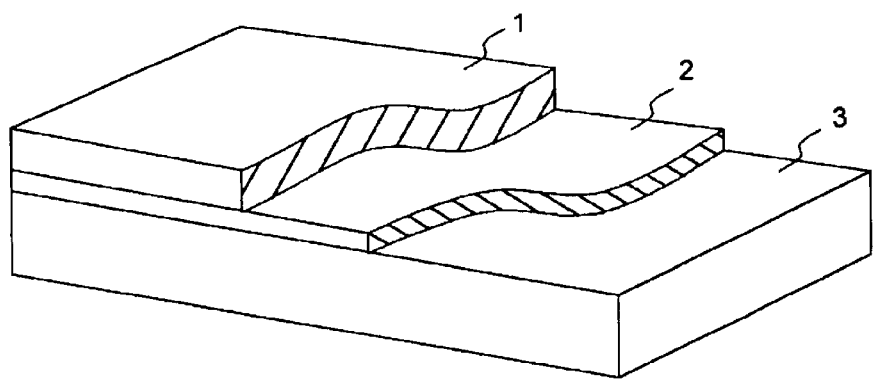
Fig. 1. Partial cut away view of the bonding structure.

BONDING OF PARTS WITH DISSIMILAR THERMAL EXPANSION COEFFICIENTS

CROSS-REFERENCE TO PROVISIONAL PATENT APPLICATION

This patent application is based on the provisional patent "Materials for bonding parts with dissimilar thermal expansion coefficients" filed Mar. 5, 2001 with the No. 60/273,070. This provisional patent was filed by Rensselaer Polytechnic Institute (RPI). Feb. 22, 2002 RPI assigned all the rights, title and interest to the intellectual property rights pertaining to this invention to the inventor, Kaspar Tobias Winther. Please see copy of the letter from RPI.

BACKGROUND OF THE INVENTION

Permanent bonding between dissimilar materials is required in many products and components. Particularly stringent requirements are found in the manufacture of Microsystems technology based components and products. In the cases where the two materials have dissimilar thermal expansion coefficients temperature fluctuations may induce fractures or permanent deformation that either cause the two different materials to break apart or shift in position relative to each other. The temperature changes can reflect cooling from the processing temperature at which the parts were bonded or temperature cycles during the lifetime of the product of which the bonded materials are a part. Different approaches have been taken to solve this problem, such as:

1. The selection of materials to be bonded such that the thermal mismatch is minimized. This approach, however, imposes severe restrictions on the selection of materials and that may not be acceptable from a functional or economic perspective, and, in particular, it excludes the bonding of two different materials with dissimilar thermal expansion coefficients.
2. Performing the bonding at the lowest possible temperature to avoid residual forces locked in during cooling following the bonding process. This approach, however, can often not be utilized due to undesired properties of the low temperature bonding methods and because it still does not address the problems caused during subsequent thermal cycles.
3. Minimizing the bonding area between the two materials. This approach, however, will not function in cases where the overall requirements to the strength of the bond are high or where high positional accuracy of the parts is required.
4. The use of a compliant layer that can absorb the thermal mismatch. This approach, however, will often allow the relative position of the parts being bonded to shift gradually over an extended number of thermal cycles thus jeopardizing product functionality. Many of these compliant materials also have a tendency to decay over time.
5. The incorporation of a multi-layer bonding structure where each layer provides an acceptable step change in the thermal expansion coefficient, sufficient inter-layer elasticity, a diffusion barrier or a layer that allows good bonding between the two neighboring layers, or the bonding structure and the materials being bonded. This approach, however, will often be costly to fabricate as each layer is deposited as a separate process step, and furthermore it can be a challenge to avoid the use of materials incompatible with the usage of the product.
6. The use of a mechanical design that allows relative motion between the parts being joined. This approach, however, will for many applications allow for too large a relative motion between the parts being joined.

BRIEF SUMMARY OF THE INVENTION

The objective of the invention is to allow long lasting bonding of materials with different thermal expansion coefficients while overcoming the aforementioned problems of the current methods. This is accomplished through the incorporation of an intermediate layer, which has gradual changes in the thermal expansion from one side of the layer to the other. Each side of the layer has a thermal expansion coefficient that is not substantially different from the thermal expansion coefficient of the material with which that side is bonded to. The intermediate layer has a sufficient thickness to avoid fractures or permanent deformation anywhere within the layer and a sufficiently high stiffness to maintain a desired level of accuracy in the relative position of the two materials even after a large number of thermal cycles.

The key benefit of this method is that the thermally induced strain is distributed across a layer of material rather than being concentrated at the interface. In this way the stress at any given point is reduced, and the material remains in the elastic region so cracks are avoided, thereby creating the basis for a long-term durable bond. In particular, bonding of components that cannot be allowed to migrate over time will benefit from this invention where conventional methods fail in providing a simple and cost effective solution.

BRIEF DESCRIPTION OF THE DRAWINGS

FIG. 1 shows a partial cut away view of the bonding structure.

DETAILED DESCRIPTION OF THE INVENTION

Some of the preferred embodiments of the present invention are described here. The process will start by identifying the two (or more) materials to be bonded together (1 and 3); these materials can be of any kind, but would generally be solids belong to one of these groups: glasses, pure metals, alloys, semiconductor materials, ceramics, cermets, composites, inorganic polymers or organic polymers. A specific example could be a silicon die that is to be bonded to a sheet formed out of a specific alloy. Additional parameters that must be identified are the temperature range to which the bond will be exposed to, including the lock-in temperature during the bonding process, the coefficients of thermal expansion for the two (or more) materials in this temperature range and the desired physical characteristics of the system.

The second step is to identify the type of intermediary layer 2, that will be used between the two materials 1 and 3, that are being bonded. The selection will depend on required physical properties, including the thermal expansion coefficients. The intermediate layer could be fabricated out of glasses, pure metals, alloys, semiconductor materials, ceramics, cermets, composites, inorganic polymers or organic polymers. A specific example could be an intermediate layer of glass fabricated from two different types of glass that match the thermal expansion of silicon and the alloy to which this silicon is to be bonded, respectively. Based on the difference in thermal expansion coefficients between the materials (e.g. silicon and alloy), the anticipated temperature range and the modulus of elasticity of the glass the desired minimum thickness of the glass is estimated. Additional thickness will be added as a preventive measure and to account for the curved shape of the diffusion profiles and differences in diffusion among the various elements. If the two glasses, for example, differ in the content of sodium, potassium and boron known diffusion coefficients for these elements in the glasses are used as a basis for calculating the combination of time and temperature that would give suitable diffusion profiles. Changes in thermal expansion coefficients can be expected to be a monotonous (although not necessarily linear) function of composition.

The intermediate layer is then fabricated by placing two flat smooth (polished or lapped, if required) clean sheets of glass in direct contact with each other in a (controlled atmosphere) furnace for at the required temperature and for the required time. At the end the temperature is reduced gradually to allow for stress relief of the glass. The flatness and evenness of the glass is verified as well as the presence of the desired compositional profile.

This intermediate layer is then bonded to the silicon die and the alloy. The bonding could for example be accomplished using an anodic bonding process. There are many circumstances where the bonding method selected for one side of the intermediate layer will be of a different nature than the bonding method selected for the other side of the intermediate layer. The result would be a silicon —glass— alloy sandwich where the glass is relatively thin and possesses gradual variations in the chemical composition from the side facing the silicon to the side facing the alloy.

The diffusion processes will to varying degrees allow all elements in the two original sheets of glass to migrate, with the net effect of bringing elements from the sheet of glass with the high concentration to the sheet of glass with the low concentration. Before all the compositional gradients have vanished the induced diffusion process are halted by cooling the glass. The result is that for most elements their concentration by the outer surfaces are close to the original concentration in the original two pieces of glass while gradual changes are seen in between. As some elements will diffuse faster than others the gradient in concentrations will vary from element to element. However, the overall effect is a gradual change in the thermal expansion coefficient of this intermediate glass layer.

As the heating of the intermediate layer can be completed prior to bonding neither the silicon die nor the alloy will necessarily have to be exposed to the high temperature required for the diffusion, thus preventing damage to structures build on them and residual forces, that may originate from forming the bonds at a temperature significantly above the temperature of usage, can be minimized.

A variation of this method is to generate the intermediate layer through forming a layer that possesses a variation in the relative proportions of different phases. Such a layer can be formed as a composite by letting filler particles settle in a layer of resin. If the resin hardens prior to the completion of the settling process one side of the intermediate layer will have a higher fraction of filler than the other. If the filler has a thermal expansion coefficient that is different from the thermal expansion coefficient of the resin the thermal expansion coefficient of the composite will change across the intermediate layer. If the different phases are all crystalline in nature diffusion can be used to provide a gradual change in the composition that will result in a gradual change in relative fraction of each of the phases, assuming a limited mutual solubility.

Another feasible process is to sandwich two materials to be bonded together with an intermediate layer between them. By heating the entire sandwich structure diffusion from the two materials into the intermediate layer will allow compositional gradients to form, thereby achieving a result similar to what was described above. The diffusion process will take place simultaneously with the bonding process and this approach could for example be combined with diffusion or eutectic bonding.

An alternative to this last method is to replace the intermediate layer with a plurality of layers, each with a different composition. This will allow for easer control of the compositional gradients irrespective of the materials being bonded to each side of this intermediate layer.

Yet another method involves the formation of the intermediate layer (e.g. glass or alloy) directly with a gradient, this could be done by simultaneous extrusion of different compositions, rolling of multiple layers or build up sheets of xero-gel precursors with changing compositions followed by sintering. Subsequent heat treatment will further smoothen the gradients. If a xero-gel is used as a glass precursor a plurality of sheets of gel with different composition can be spin coated onto one of the materials that are to be bonded. Once the gels are dried sintering and diffusion can take place to form a glass intermediate layer with a compositional gradient.

What is claimed is:

1. A method to join materials comprising the following steps:
    (a) providing an intermediate layer with gradual changes in chemical composition and thermal expansion coefficients across said intermediate layer in a direction perpendicular to the bonding surface, where said changes in composition have been achieved predominatly through diffusion of elements and
    (b) means of bonding said materials to each side of said intermediate layer whereby said materials can be joined in a manner that withstands changes in temperature despite said materials having different thermal expansion coefficients.

2. The method of joining according to claim 1 in which said diffusion processes are taking place between at least two originally distinct layers or sheets of material.

3. The method of joining of claim 2 wherein said diffusion processes are taking place prior to said bonding.

4. The method of joining according to claim 1 in which said changes in the chemical composition are formed through diffusion into an originally homogeneous intermediate layer or sheets of material.

5. The method of joining of claim 4 wherein said diffusion processes are taking place prior to said bonding.

6. The method of joining according to claim 1 wherein said intermediate layer is a glass.

7. The method of joining according to claim 1 wherein the gradual change in thermal expansion coefficients across said intermediate layer is formed through diffusion from said materials being bonded into said intermediate layer.

8. The method of joining according to claim 7 in which said intermediate lever prior to processing was predominantly homogeneous and after the bonding shows a compositional gradient extending a significant distance into said intermediate layer in a direction perpendicular to the bonding surface.

9. A method to join materials comprising the following steps:
    (a) diffusion bonding;
    (b) heat treatment at a temperature and duration to induce substantial diffusion beyond what is required for the bonding to take place, whereby said materials can be joined in a manner that withstands changes in temperature despite said materials having different thermal expansion coefficients.

* * * * *